United States Patent
Liu et al.

(10) Patent No.: US 7,495,522 B2
(45) Date of Patent: Feb. 24, 2009

(54) SIGNAL TRANMISSION LINE HAVING CONTACT PORTION

(75) Inventors: Cheng-Hong Liu, Tu-Cheng (TW); Shou-Kuo Hsu, Tu-Cheng (TW); Yu-Chang Pai, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 186 days.

(21) Appl. No.: 11/309,279

(22) Filed: Jul. 21, 2006

(65) Prior Publication Data
US 2007/0090512 A1    Apr. 26, 2007

(30) Foreign Application Priority Data
Oct. 26, 2005   (CN) .................. 2005 1 0100776

(51) Int. Cl.
*H01P 3/04* (2006.01)
*H01P 5/02* (2006.01)

(52) U.S. Cl. ............................... 333/4; 333/33

(58) Field of Classification Search .............. 333/1, 333/4, 5, 24 R, 33
See application file for complete search history.

(56) References Cited

U.S. PATENT DOCUMENTS

| 5,777,526 | A  * | 7/1998  | Kawasaki ............. 333/1 |
| 7,002,432 | B2   | 2/2006  | Hsu |
| 2003/0132812 | A1 * | 7/2003  | Lohr ............... 333/1 |
| 2006/0290440 | A1 * | 12/2006 | Benham ........... 333/24 R |

* cited by examiner

*Primary Examiner*—Benny Lee
(74) *Attorney, Agent, or Firm*—Wei Te Chung

(57) ABSTRACT

A signal transmission line used in a printed circuit board (PCB), the signal transmission line comprises a driving terminal for driving a signal, a contact portion, the signal line connected with the driving terminal and the contact portion to transmit the signal wherein a length of the signal line is so arranged that a time for the signal transmitted from the driving terminal to the contact portion is not less than half of a time for the transmitted signal to reach a receiving terminal.

8 Claims, 6 Drawing Sheets

SIGNAL TRANMISSION LINE HAVING CONTACT PORTION

FIELD OF THE INVENTION

The invention relates to signal routing on a Printed Circuit Board (PCB), more particularly to a signal transmission line on a PCB.

DESCRIPTION OF RELATED ART

Signal integrity is an important factor to be taken into account when a printed circuit board (PCB) is designed. A well-designed PCB has an elevated on-off switching speed of integrated circuits, a high density, and a compact layout of components. Parameters of the components and of the PCB substrate, a layout of the components on the PCB, and a layout of high-speed signal transmission lines all have an impact on signal integrity. In turn, proper signal integrity helps the PCB and an associated computer system to achieve stable performance.

A plurality of test portions and/or solder portions are formed on a PCB, the test portions and the solder portions are metal cushions wherein the test portions are probe contact points during signal testing and the solder portions are used for soldering surface mounted devices onto the PCB. Referring to FIG. 1, a conventional signal transmission line includes a driving terminal 10, a contact portion 14, a signal line 12 connected with the driving terminal 10 and the contact portion 14, and a receiving terminal 16. The contact portion 14 includes a test portion and a solder portion. However, a downside to using contact portions is there will be a mismatch in impedance between the signal line 12 and the contact portion 14.

The impedance mismatch between the signal line 12 and the contact portion 14 causes a signal transmitted on the signal line 12 to reflect at the impedance-discontinuity of the contact portion 14 and returns a part of the signal to the driving terminal 10 (also called 'ringback'), the returning signal may change the logic state of the signal to be transmitted at the driving terminal 10. The impedance mismatch between the signal line 12 and the impedance-discontinuity contact portion 14 has a negative impact on signal integrity so it is an important consideration in the design of the PCB.

Referring to FIG. 2, an eye diagram illustrating signal performance of the conventional signal transmission line of FIG. 1 is shown. The horizontal ordinate represents time in (*10^-9)s. The vertical ordinate represents the voltage of differential signals. As can be seen in the diagram a depressed portion 18 near the top of the eye diagram indicates an occurrence of ringback. The ringback reduces the quality and integrity of the signal transmitted on the signal line.

What is needed is an improved signal transmission line which enhances signal integrity and overcomes impedance-discontinuity in the signal transmission line.

SUMMARY OF THE INVENTION

An exemplary signal transmission line used on a printed circuit board (PCB), the signal transmission line comprises a driving terminal for driving a signal, a contact portion, the signal line connected with the driving terminal and the contact portion to transmit the signal, wherein a length of the signal line is so arranged that an elapsed time of a transmission of a signal from the driving terminal to the contact portion is not less than half of a time needed for the transmitted to reach an intended receiving point.

Other advantages and novel features will become more apparent from the following detailed description when taken in conjunction with the accompanying drawing, in which:

DETAILED DESCRIPTION OF THE INVENTION

Figure 3:
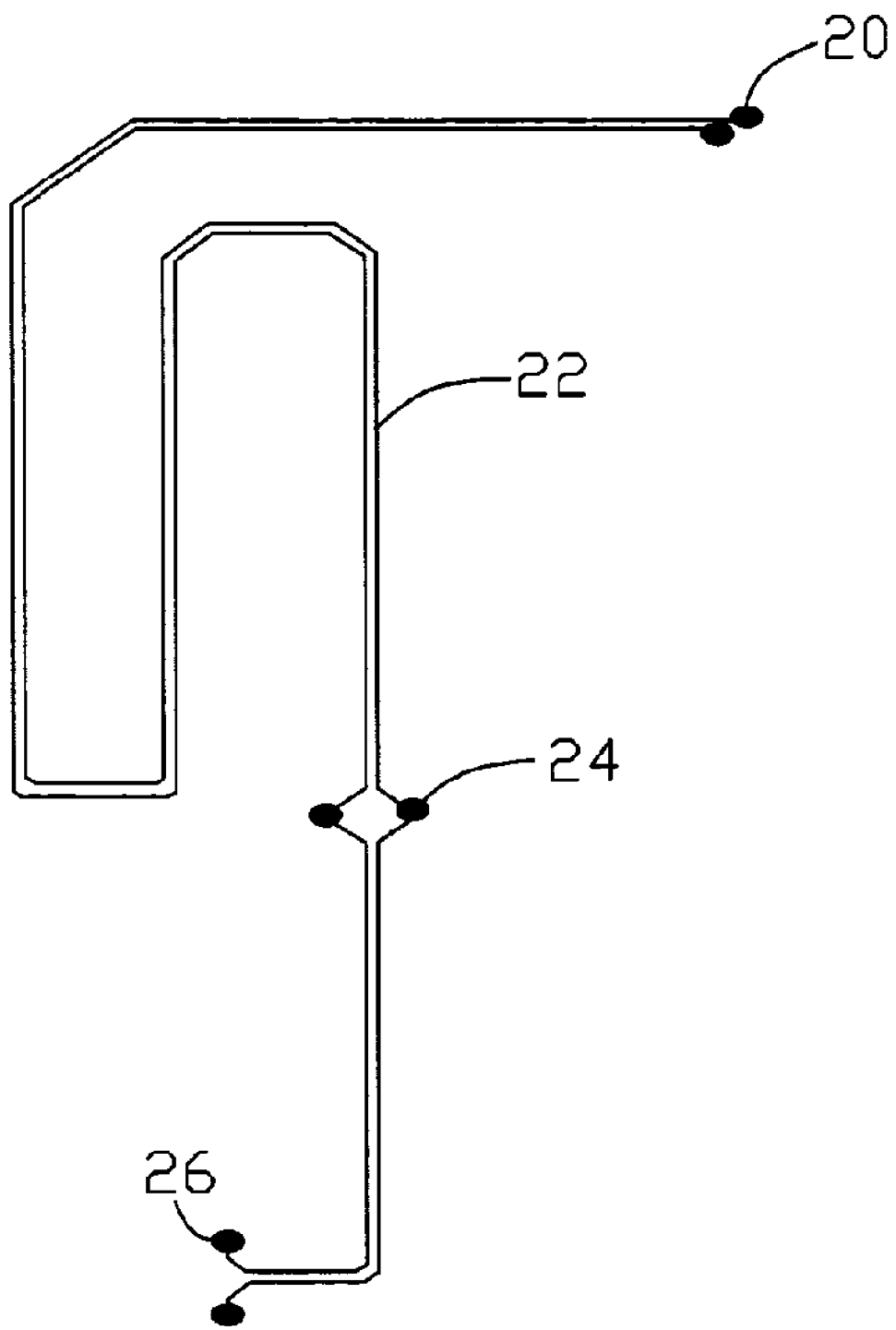
FIG. 3 is a plane view of a signal transmission line in accordance with a first preferred embodiment of the present invention.

Referring to FIG. 3, a signal transmission line 22 to be arranged in a circuit assembly like a printed circuit board (PCB) in accordance with a first preferred embodiment of the present invention includes a driving terminal 20, and a contact portion 24, the signal line 22 is connected with the driving terminal 10 and the contact portion 24, and a receiving terminal 26. The signal transmission line 22 between the driving terminal 20 and the contact portion 24 is arranged to form a serpentine or winding shape in order to save space of the PCB.

A signal (not shown) is transmitted from the driving terminal 20 through the signal line 22 to the contact portion 24. The contact portion 24 includes at least a test portion or a solder portion.

A distance a signal travels from the driving terminal 20 to the contact portion 24 is greater than a distance the signal travels from the contact portion 24 to the receiving terminal 26, i.e., the distance a signal travels from the driving terminal 20 to the contact portion 24 is not less than a half of a whole distance that the signal travels from the driving terminal 20 to the receiving terminal 26. Thus, the signal arrives at the receiving terminal 26 before a portion of the signal, which is reflected back at the contact portion 24 due to a mismatch in impedance between the contact portion 24 and the signal line 22, arrives at the driving terminal 20.

Figure 1:
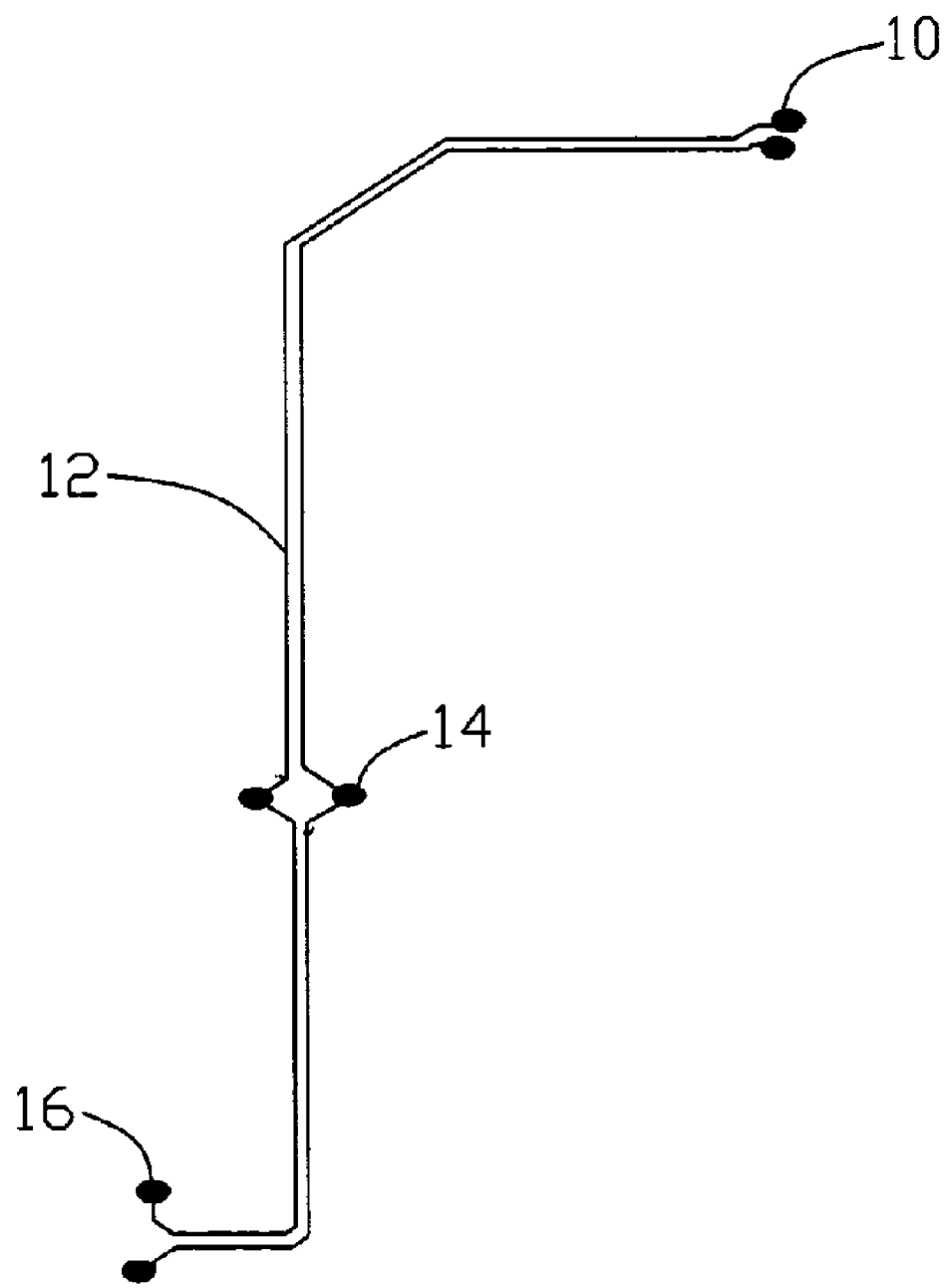
FIG. 1 is a plane view of a conventional signal transmission line.
Figure 2:
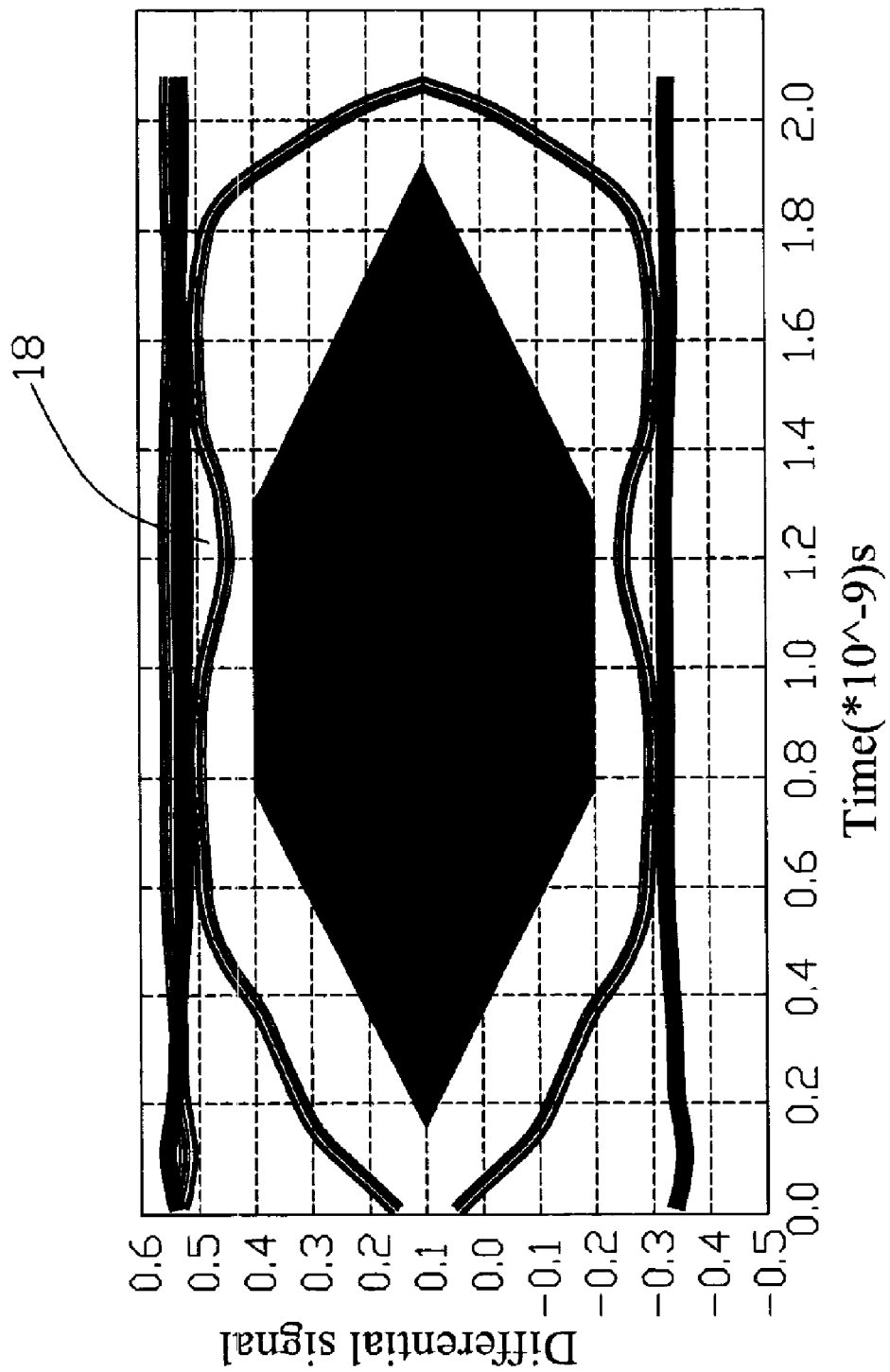
FIG. 2 is a plane view of an eye diagram of a signal transmitted over the signal transmission line of FIG. 1.
Figure 6:
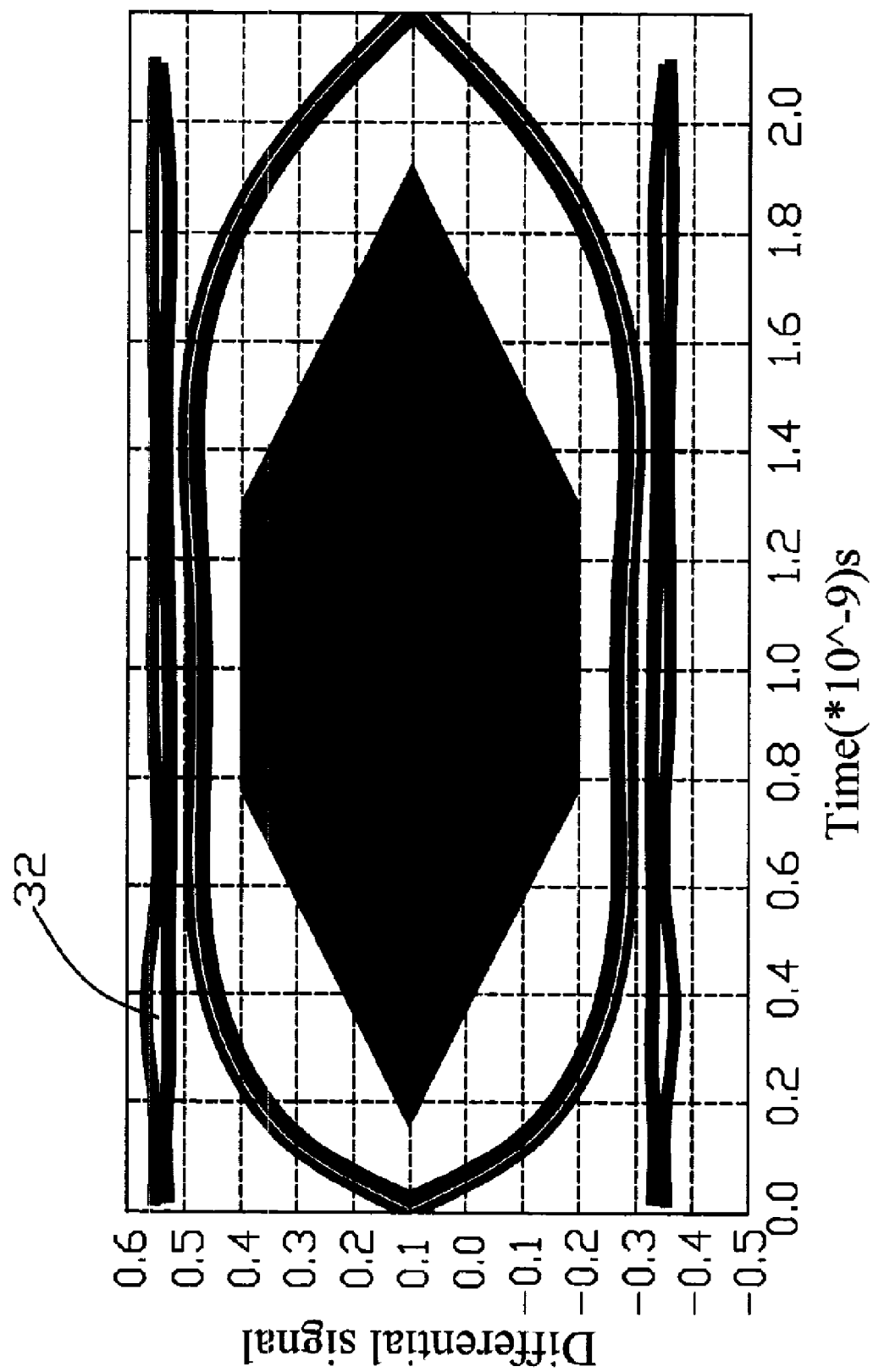
FIG. 6 is a plane view of an eye diagram of a signal transmitted over the signal transmission line corresponding to the first preferred embodiment of the present invention.

Referring to FIG. 6, an eye diagram of a signal transmitted over the signal transmission line 22 of the preferred embodiment is shown. The horizontal ordinate represents time in (*10^-9)s. The vertical ordinate represents the voltage of differential signals. A depressed portion 32 near top of the eye diagram indicates an occurrence of ringback. As can be seen when comparing the eye diagram of FIG. 6 with the eye diagram of FIG. 2, a transmission line configured as described in the preferred embodiment has a greatly reduced occurrence of ringback thus ensuring integrity of the signal.

Figure 4:
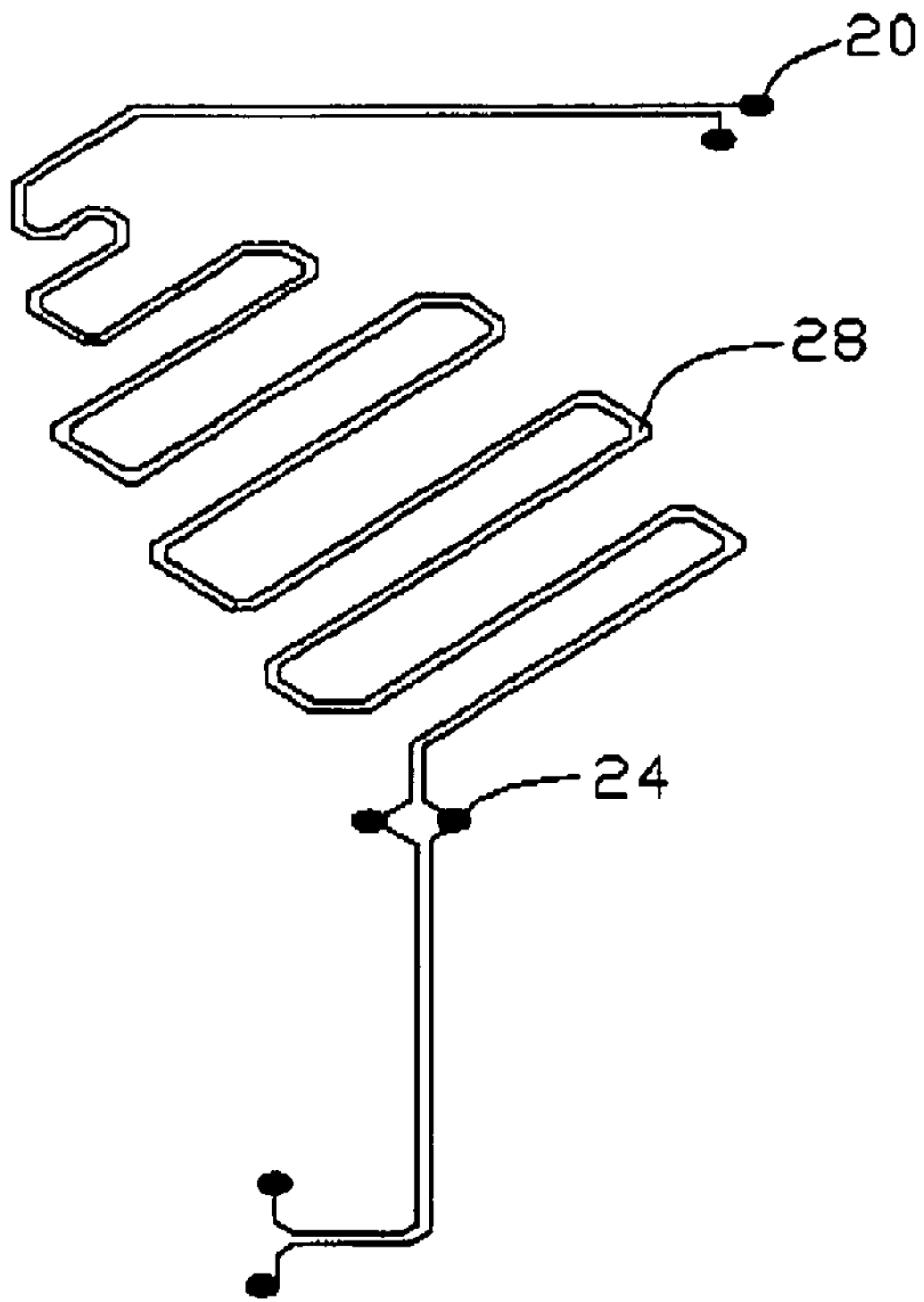
FIG. 4 is a plane view of a signal transmission line in accordance with a second preferred embodiment of the present invention.
Figure 5:
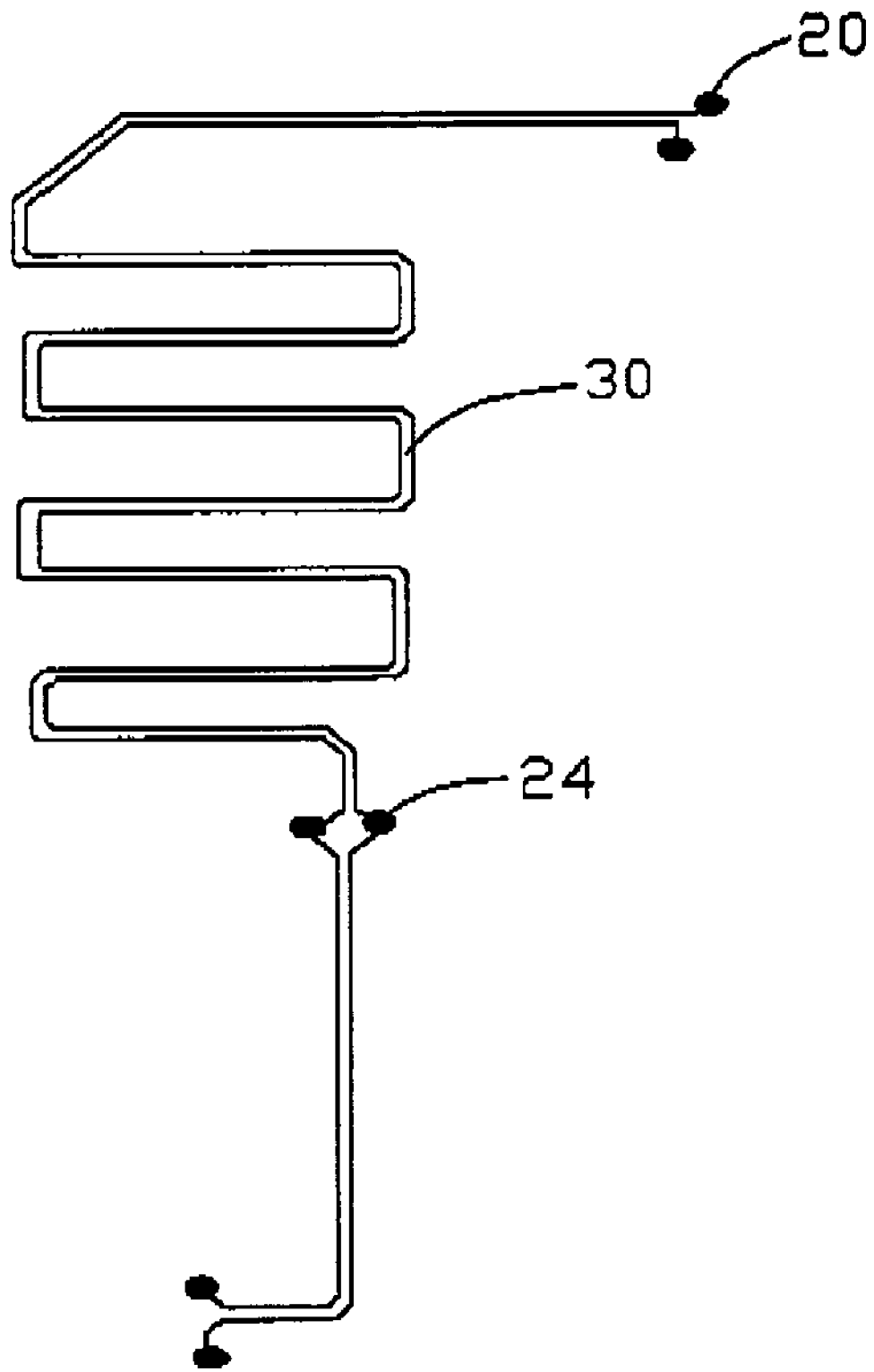
FIG. 5 is a plane view of a signal transmission line in accordance with a third preferred embodiment of the present invention.

Further embodiments include those shown in FIG. 4 and FIG. 5, each of which shows a different way of winding of the signal transmission line 28 (FIG. 4) or 30 (FIG. 5) between the driving terminal 20 and the contact portion 24, but may include any configuration of a signal transmission line wherein the distance traveled by a transmitted signal to a contact portion is greater than a distance traveled by the signal from the contact portion to a receiving terminal. Thereby ensuring that a time of the transmitted signal to go from a driving terminal to the receiving terminal is less than a one half of time for a portion of the signal to travel from the driving terminal to the contact portion and be reflected (ringback) back to the driving terminal.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments.

What is claimed is:

1. A signal transmission line used in a Printed Circuit Board (PCB), the signal transmission line comprising:
   a driving terminal;
   a receiving terminal; and
   a contact portion between the driving terminal and the receiving terminal, wherein the contact portion comprises a solder portion;
   the signal transmission line connected with the driving terminal and the contact portion to transmit the signal;
   wherein a length of the signal transmission line is so arranged that a time for a signal transmitted from the driving terminal to reach the contact portion is not less than half of a time for the transmitted signal to reach the receiving terminal.

2. The signal transmission line as claimed in claim 1, wherein the contact portion comprises a test portion.

3. The signal transmission line as claimed in claim 1, wherein the signal line has a serpentine shape.

4. A method for routing a signal transmission line in a printed circuit board (PCB), the method comprising:
   providing a driving terminal for driving a signal;
   providing a contact portion, wherein the contact portion comprises a solder portion; and
   connecting the signal transmission line with the driving terminal and the contact portion to transmit the signal;
   arranging a length of the signal line so that a time the signal transmitted from the driving terminal to the contact portion is not less than half of a time for the transmitted signal to reach a receiving terminal.

5. The method as claimed in claim 4, wherein the signal line has a serpentine shape.

6. The method as claimed in claim 4, wherein the contact portion comprises a test portion.

7. A method for routing a signal transmission line in a circuit assembly, comprising the steps of:
   defining a signal transmission line in a circuit assembly;
   setting one end of said signal transmission line as a driving terminal to transmit signals into said signal transmission line, and the other end of said signal transmission line as a receiving terminal to receive said signals transmitted through said signal transmission line; and
   placing a contact portion beside said signal transmission line between said driving terminal of said signal transmission line and said receiving terminal of said signal transmission line in a way that said signal transmission line passes through said contact portion and electrically connects therewith, and a time that said transmitted signals travel from said driving terminal of said signal transmission line to said contact portion is not less than a half of a time that said transmitted signals travel from said driving terminal of said signal transmission line to said receiving terminal of said signal transmission line, wherein the contact portion comprises a solder portion.

8. The method as claimed in claim 7, wherein the signal line comprises a serpentine shape formed between said driving terminal of said signal transmission line and said contact portion.

* * * * *